United States Patent
Cheng et al.

(10) Patent No.: US 9,478,549 B2
(45) Date of Patent: Oct. 25, 2016

(54) FINFET WITH DIELECTRIC ISOLATION BY SILICON-ON-NOTHING AND METHOD OF FABRICATION

(71) Applicant: GLOBALFOUNDRIES Inc., Grand Cayman (KY)

(72) Inventors: Kangguo Cheng, Schenectady, NY (US); Balasubramanian S. Haran, Watervliet, NY (US); Shom Ponoth, Clifton Park, NY (US); Theodorus Eduardus Standaert, Clifton Park, NY (US); Tenko Yamashita, Schenectady, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/529,332

(22) Filed: Oct. 31, 2014

(65) Prior Publication Data

US 2015/0064855 A1     Mar. 5, 2015

Related U.S. Application Data

(62) Division of application No. 13/737,002, filed on Jan. 9, 2013, now Pat. No. 9,000,522.

(51) Int. Cl.
| | |
|---|---|
| *H01L 21/84* | (2006.01) |
| *H01L 27/108* | (2006.01) |
| *H01L 21/762* | (2006.01) |
| *H01L 27/12* | (2006.01) |

(52) U.S. Cl.
CPC ... *H01L 27/10826* (2013.01); *H01L 21/76224* (2013.01); *H01L 21/76243* (2013.01); *H01L 21/76283* (2013.01); *H01L 21/845* (2013.01); *H01L 27/1211* (2013.01)

(58) Field of Classification Search
CPC .............................. H01L 21/84; H01L 21/762
USPC .......................... 257/347, 255, 408, 330, 402
See application file for complete search history.

(56) References Cited

U.S. PATENT DOCUMENTS

| | | | |
|---|---|---|---|
| 7,696,568 | B2 | 4/2010 | Hwang et al. |
| 7,709,341 | B2 | 5/2010 | Fucsko et al. |
| 7,800,152 | B2 | 9/2010 | Zhu et al. |

(Continued)

FOREIGN PATENT DOCUMENTS

| | | |
|---|---|---|
| CN | 101814523 A | 8/2010 |
| CN | 102856205 A | 1/2013 |
| CN | 101814523 B | 3/2014 |

OTHER PUBLICATIONS

"Method and Structure for Forming a Localized SOI FinFET" U.S. Appl. No. 13/670,768, filed Nov. 7, 2012, First Inventor: Kangguo Cheng.

(Continued)

*Primary Examiner* — Chuong A Luu
*Assistant Examiner* — Rodolfo Fortich
(74) *Attorney, Agent, or Firm* — Heslin Rothenberg Farley & Mesiti P.C.; George Blasiak

(57) ABSTRACT

An improved finFET and method of fabrication using a silicon-on-nothing process flow is disclosed. Nitride spacers protect the fin sides during formation of cavities underneath the fins for the silicon-on-nothing (SON) process. A flowable oxide fills the cavities to form an insulating dielectric layer under the fins.

10 Claims, 20 Drawing Sheets

(56) References Cited

U.S. PATENT DOCUMENTS

| | | |
|---|---|---|
| 7,897,465 B2 | 3/2011 | Hwang et al. |
| 8,178,911 B2 | 5/2012 | Hwang et al. |
| 8,846,466 B2 | 9/2014 | Yuan et al. |
| 2005/0233565 A1 | 10/2005 | Zhu et al. |
| 2008/0277725 A1* | 11/2008 | Shino ............... H01L 21/84 257/347 |
| 2008/0290387 A1 | 11/2008 | Hwang et al. |
| 2011/0084340 A1 | 4/2011 | Yuan et al. |
| 2011/0133263 A1 | 6/2011 | Hwang et al. |
| 2012/0025313 A1 | 2/2012 | Chang et al. |
| 2014/0048881 A1 | 2/2014 | Kanike et al. |
| 2014/0175554 A1* | 6/2014 | Loubet et al. ................ 257/368 |

OTHER PUBLICATIONS

Notice of Allowance and Fee(s) Due, dated Aug. 4, 2015, U.S. Appl. No. 14/529,825.
SIPO Search in Chinese Application No. CN201400093307 (with English translation), Feb. 19, 2016.
SIPO Office Action in Chinese Application No. CN2014100093307 (with English translation), Mar. 1, 2016.
Common Citation Document (CCD) View Report, fiveipoffices-CCD, for U.S. Appl. No. 14/529,332, Report Generated Aug. 23, 2016.

* cited by examiner

FINFET WITH DIELECTRIC ISOLATION BY SILICON-ON-NOTHING AND METHOD OF FABRICATION

CROSS REFERENCE TO RELATED APPLICATIONS

This application is a division of commonly-owned, copending U.S. patent application Ser. No. 13/737,002 entitled FINFET WITH DIELECTRIC ISOLATION BY SILICON-ON-NOTHING AND METHOD OF FABRICATION and filed on Jan. 9, 2013.

FIELD OF THE INVENTION

The present invention relates generally to semiconductor fabrication, and more particularly, to a FinFET with dielectric isolation by silicon-on-nothing and methods of fabrication.

BACKGROUND OF THE INVENTION

With the continuing trend towards miniaturization of integrated circuits (ICs), there is a need for transistors to have higher drive currents with increasingly smaller dimensions. Fin field effect transistor (FinFET) technology is becoming more prevalent as device size continues to shrink. Silicon-on-insulator (SOI) finFET devices have excellent electrical performance. However, the manufacturing cost is high. Bulk finFETs, where there is no insulator film between the fins and the substrate, have a lower manufacturing cost as compared with a SOI finFET. However, bulk finFETs are prone to leakage currents which can degrade the electrical performance. It is therefore desirable to have improved finFETs and methods of fabrication.

SUMMARY OF THE INVENTION

In one aspect of the present invention, a semiconductor structure is provided. The structure comprises a semiconductor substrate, an insulator layer disposed over the semiconductor substrate, a plurality of semiconductor fins disposed on the insulator layer; and a plurality of embedded spacers disposed in the insulator layer adjacent to each fin.

In another aspect of the present invention, a method of forming a semiconductor structure is provided. The method comprises forming a sacrificial layer on a semiconductor substrate, forming fins on the sacrificial layer, forming a shallow trench isolation region on the semiconductor substrate, wherein the shallow trench isolation region is disposed in between each fin, forming spacers on the fins, recessing the shallow trench isolation region, removing the sacrificial layer, thereby forming a void in the semiconductor structure, depositing an insulator layer in the void, wherein the insulator layer partially covers the spacers, leaving an exposed portion of the spacers, and removing the exposed portion of the spacers.

In another aspect of the present invention, a method of forming a semiconductor structure is provided. The method comprises forming fins on a semiconductor substrate, wherein the fins have sides, forming spacers on the sides of each fin, forming a mask region on a first group of fins, and leaving a second group of fins unmasked, forming a cavity in the semiconductor substrate between each of the unmasked fins, expanding each cavity between each of the unmasked fins with an undercut etch, filling each cavity between each of the unmasked fins with an insulator material, forming a cavity in the semiconductor substrate between each of the first group of fins, expanding each cavity between each of the first group of fins with an undercut etch, and filling each cavity between each of the first group of fins with an insulator material.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
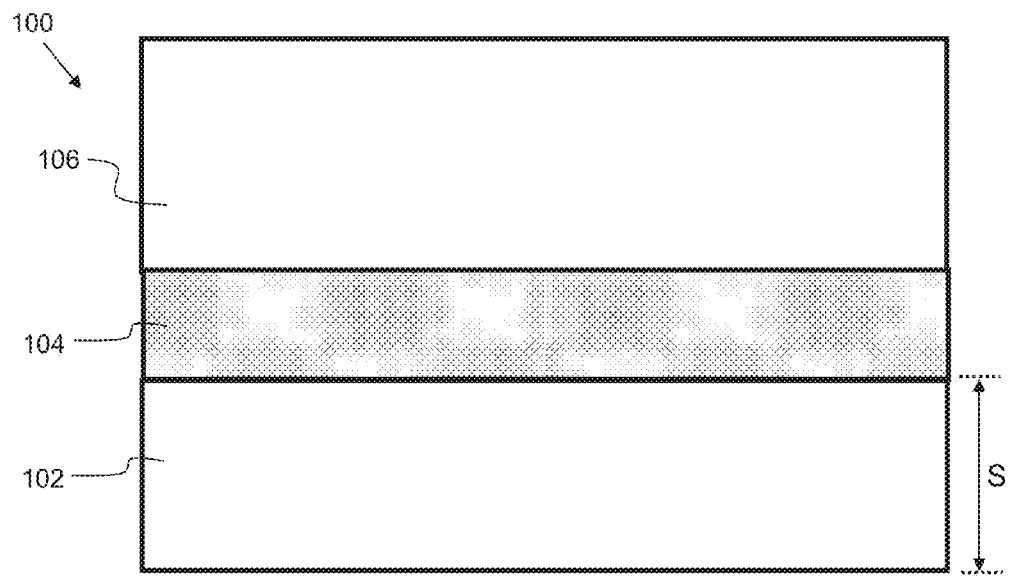

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 shows a side view of a semiconductor structure at a starting point for an embodiment of the present invention.

Figure 2:
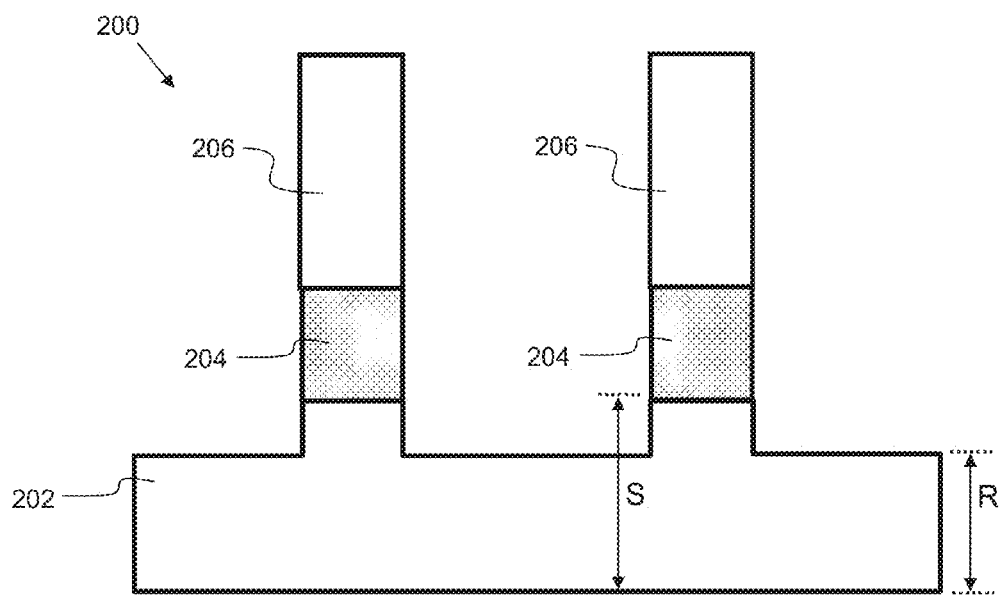

FIG. 2 shows a semiconductor structure after a subsequent process step of fin formation.

Figure 3:
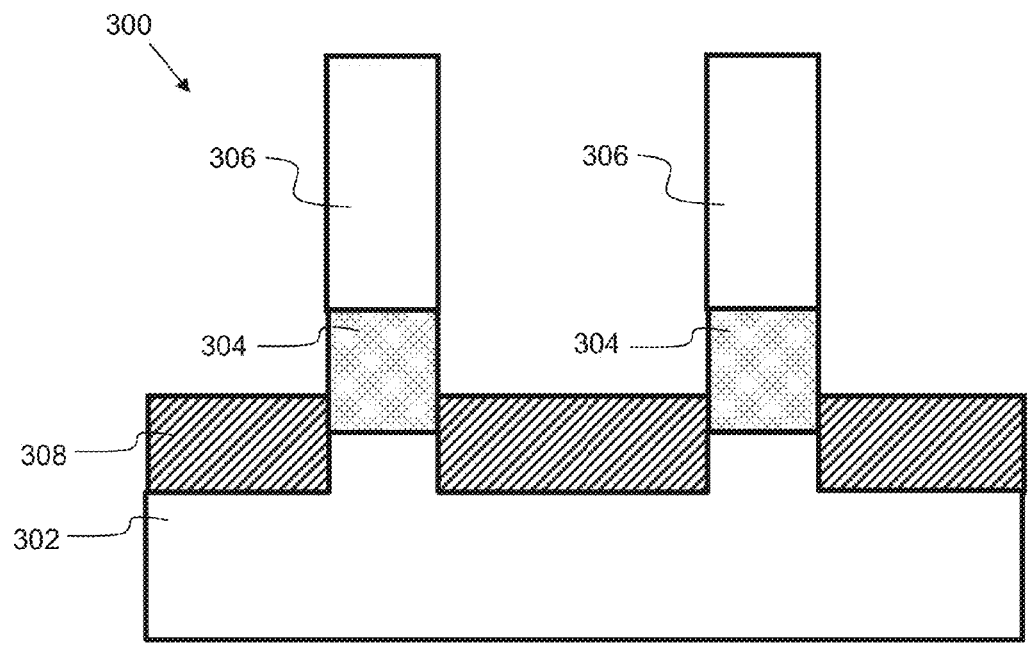

FIG. 3 shows a semiconductor structure after a subsequent process step of depositing a shallow trench isolation region.

Figure 4:
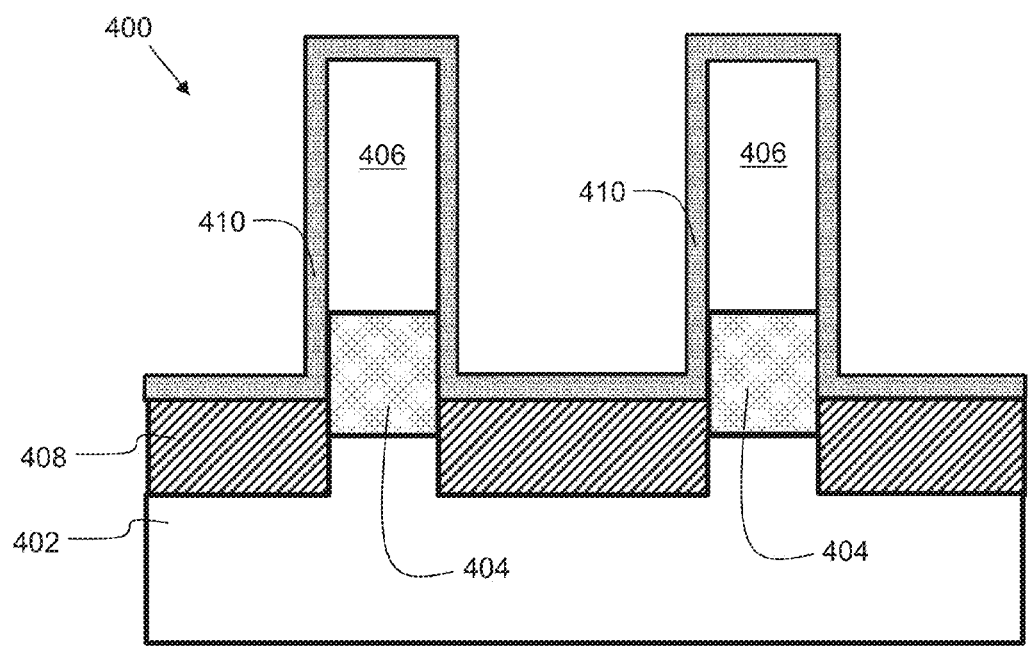

FIG. 4 shows a semiconductor structure after a subsequent process step of depositing a gate dielectric layer.

Figure 5:
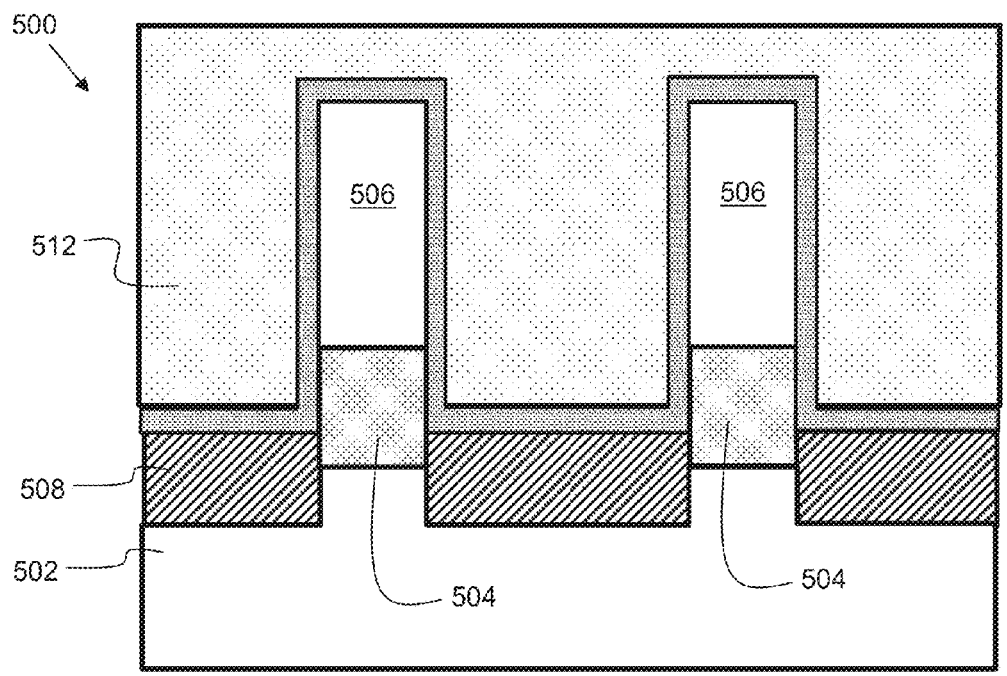

FIG. 5 shows a semiconductor structure after a subsequent process step of forming a gate region.

Figure 6:
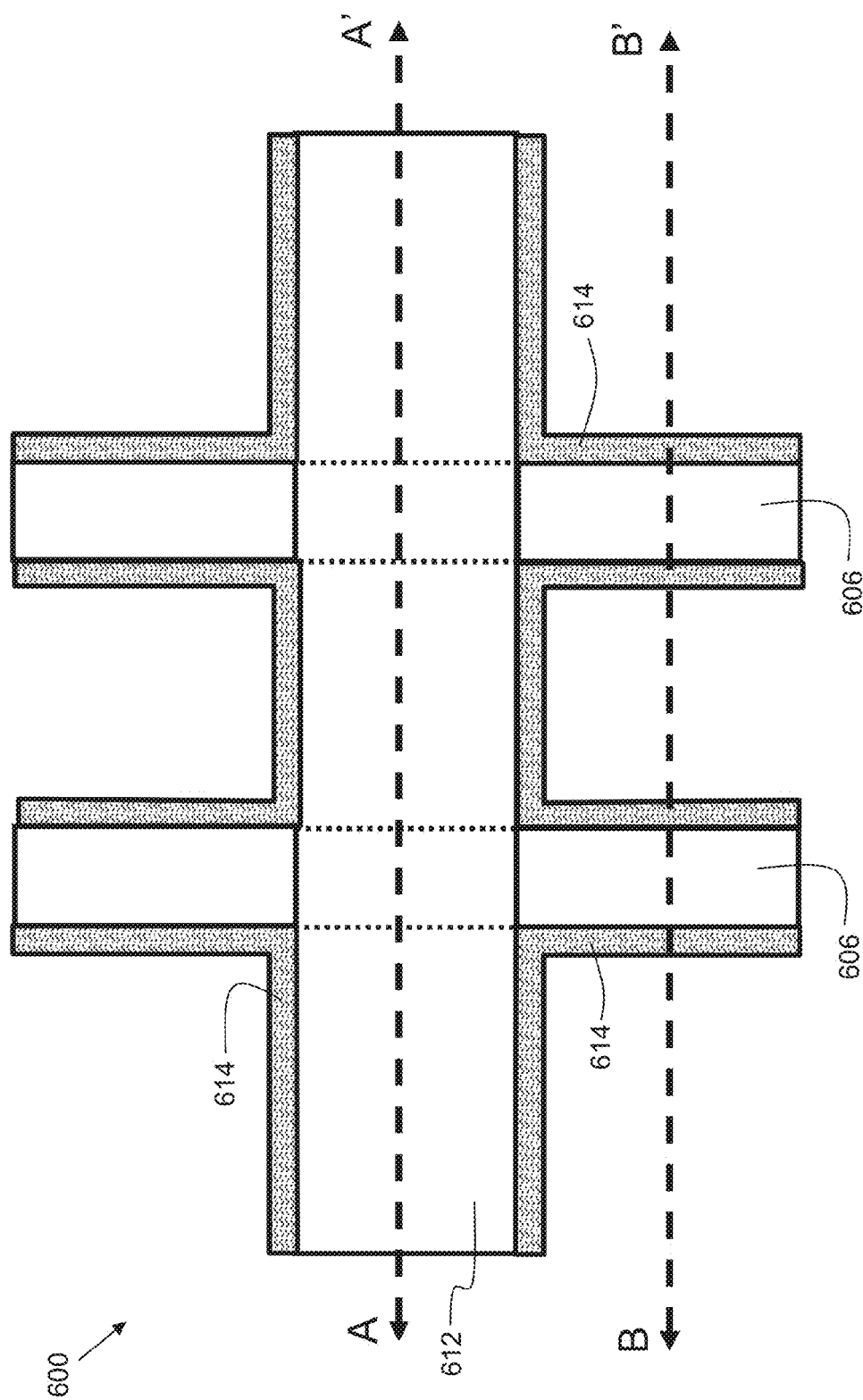

FIG. 6 shows a top down view of a semiconductor structure after a subsequent process step of spacer formation.

Figure 7:
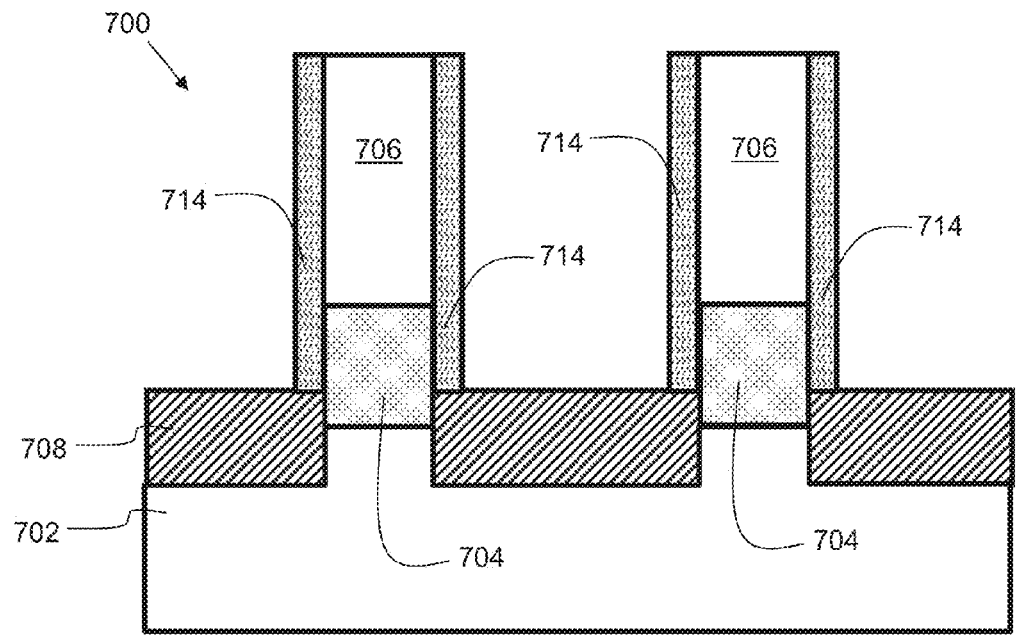

FIG. 7 shows a side view of the embodiment of FIG. 6 along line B-B'.

Figure 8:
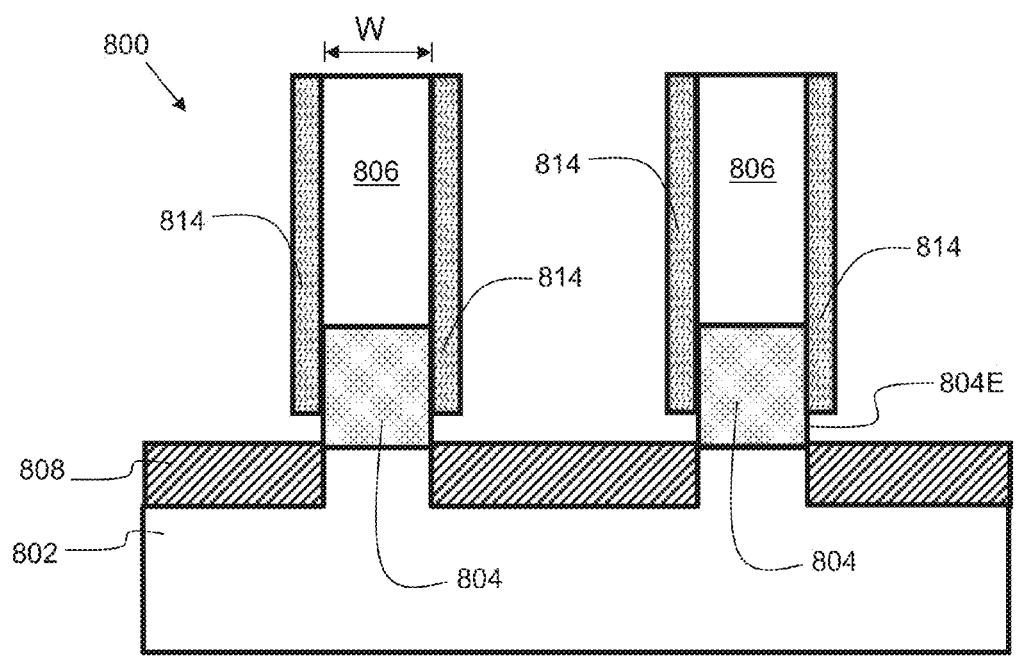

FIG. 8 shows a semiconductor structure after a subsequent process step of recessing the shallow trench isolation region.

Figure 9:
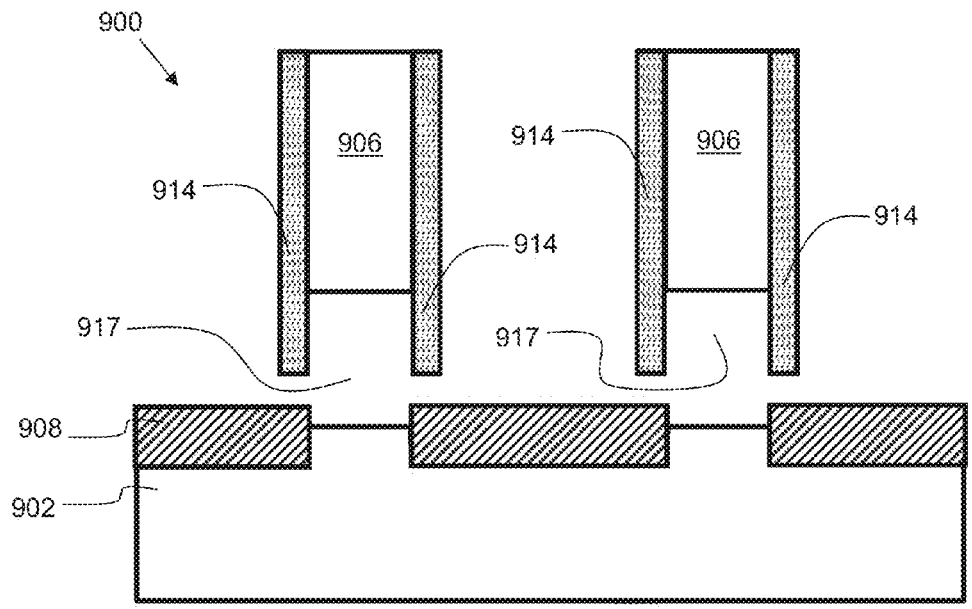

FIG. 9 shows a semiconductor structure after a subsequent process step of removing the sacrificial layer.

Figure 10:
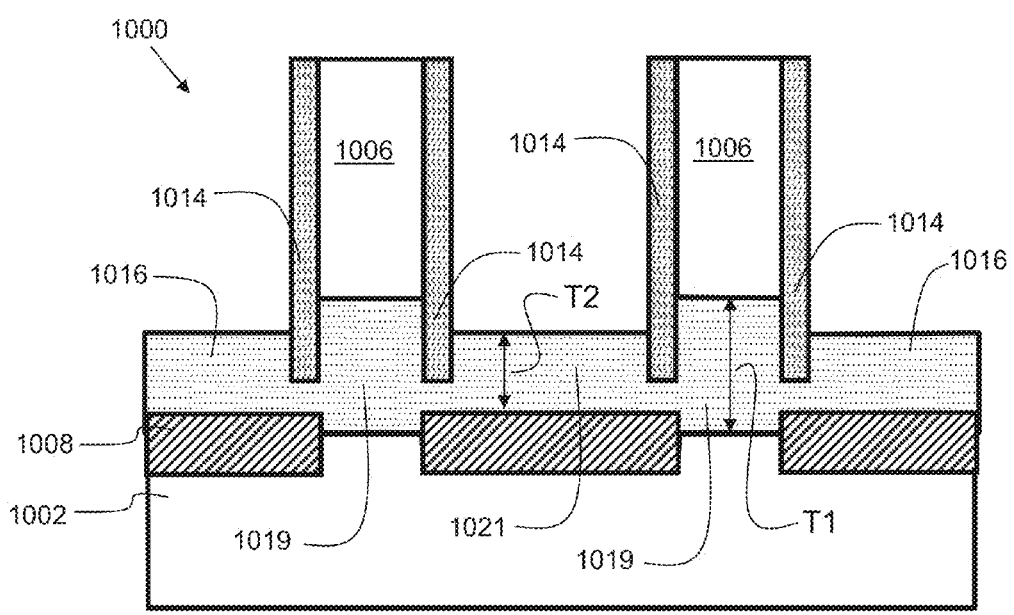

FIG. 10 shows a semiconductor structure after a subsequent process step of depositing a dielectric layer.

Figure 11:
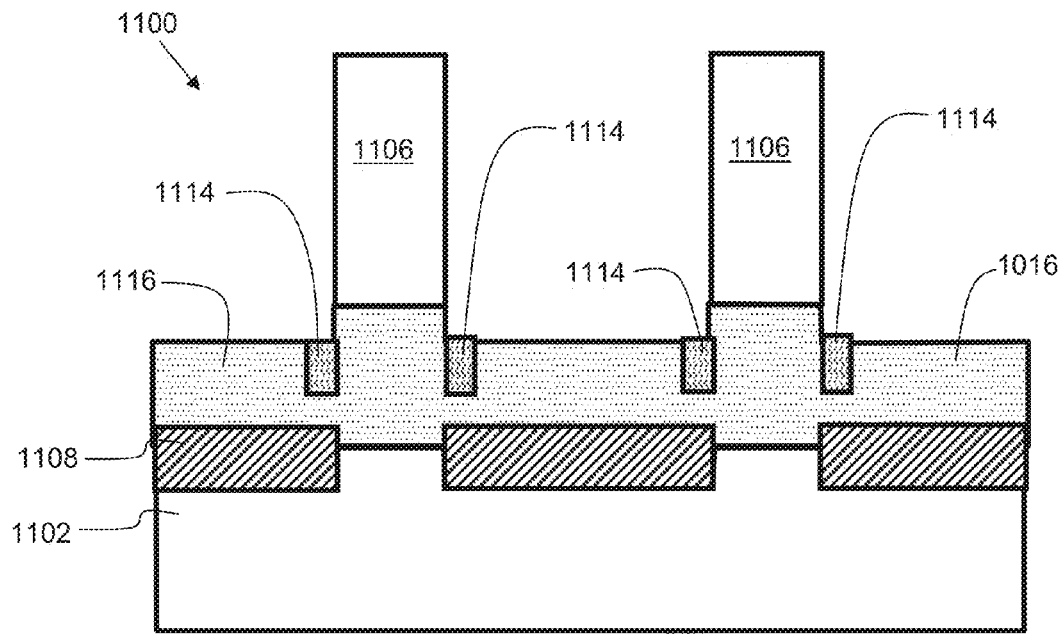

FIG. 11 shows a semiconductor structure after a subsequent process step of recessing the spacers.

Figure 12:
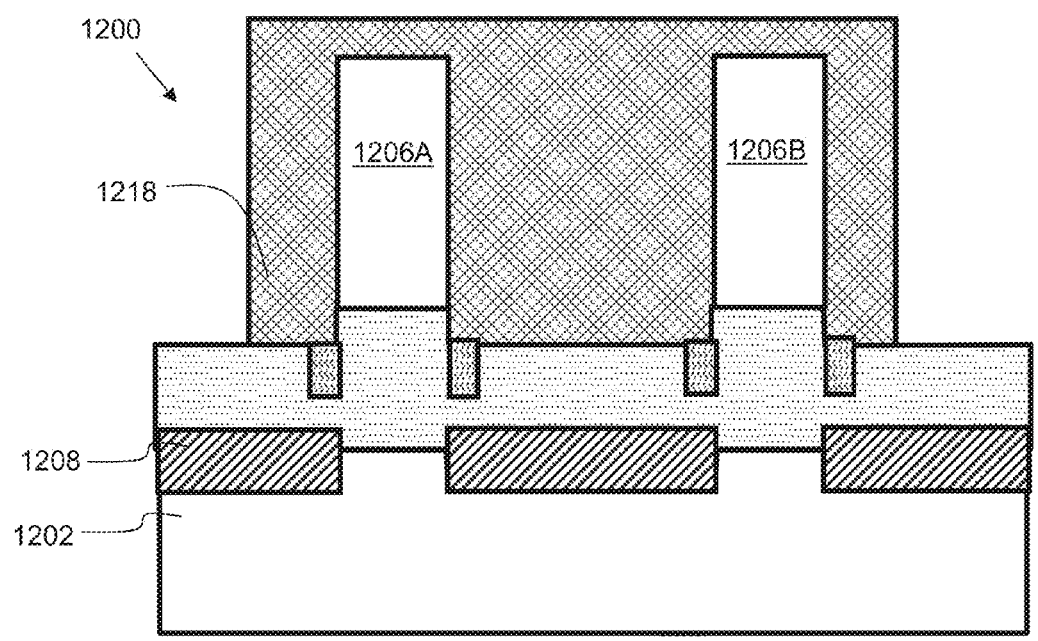

FIG. 12 shows a semiconductor structure after a subsequent process step of fin merging.

Figure 13:
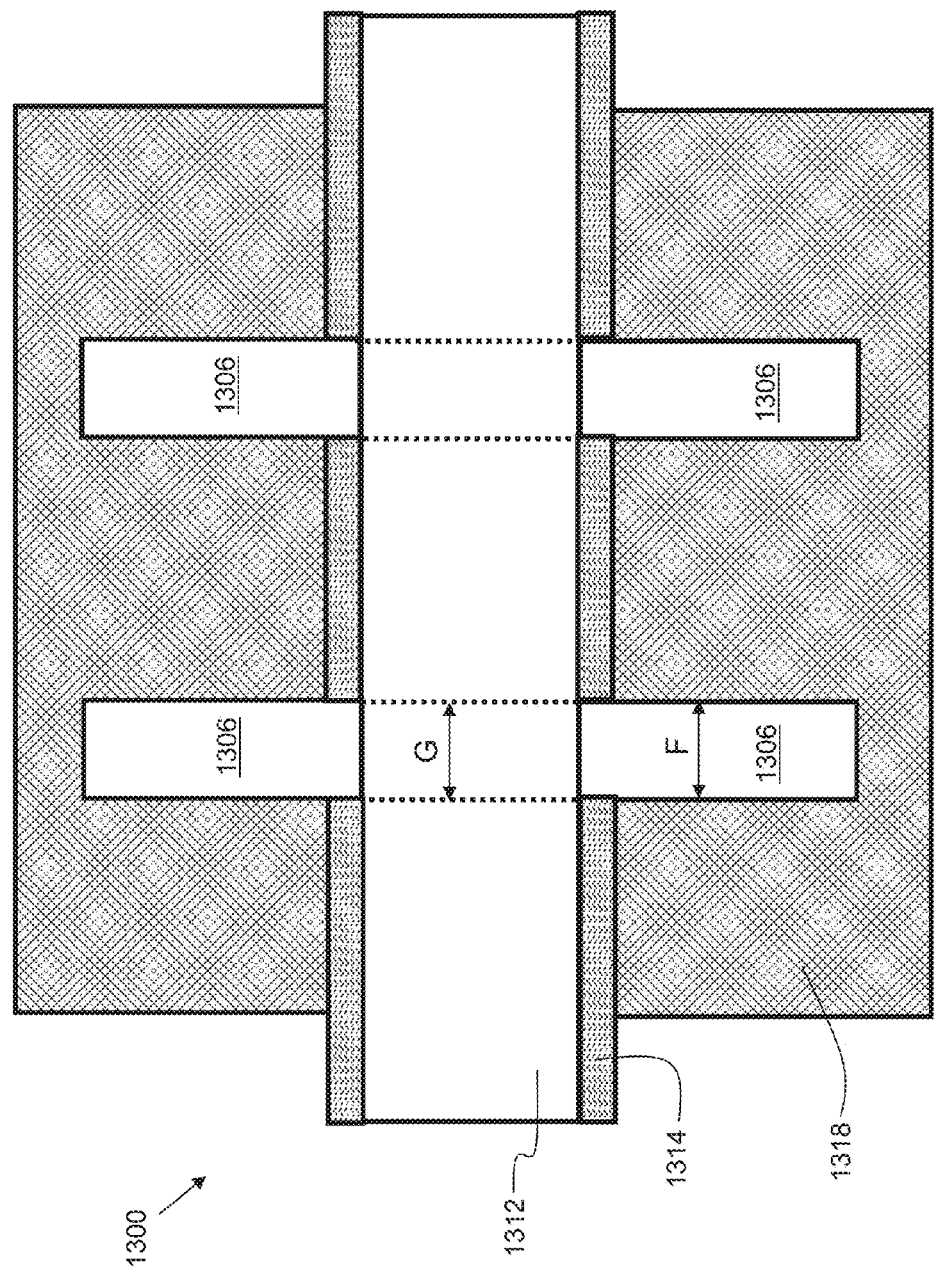

FIG. 13 shows a top down view of a semiconductor structure similar to that shown in FIG. 12.

Figure 14:
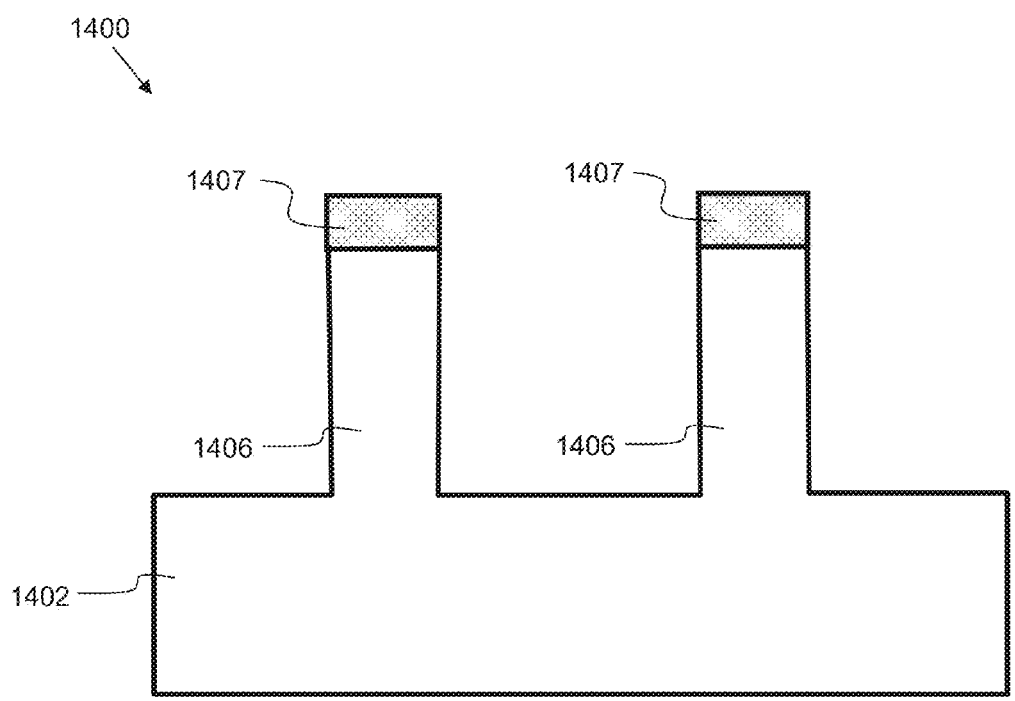

FIG. 14 shows a side view of a semiconductor structure at a starting point for an alternative embodiment of the present invention.

Figure 15:
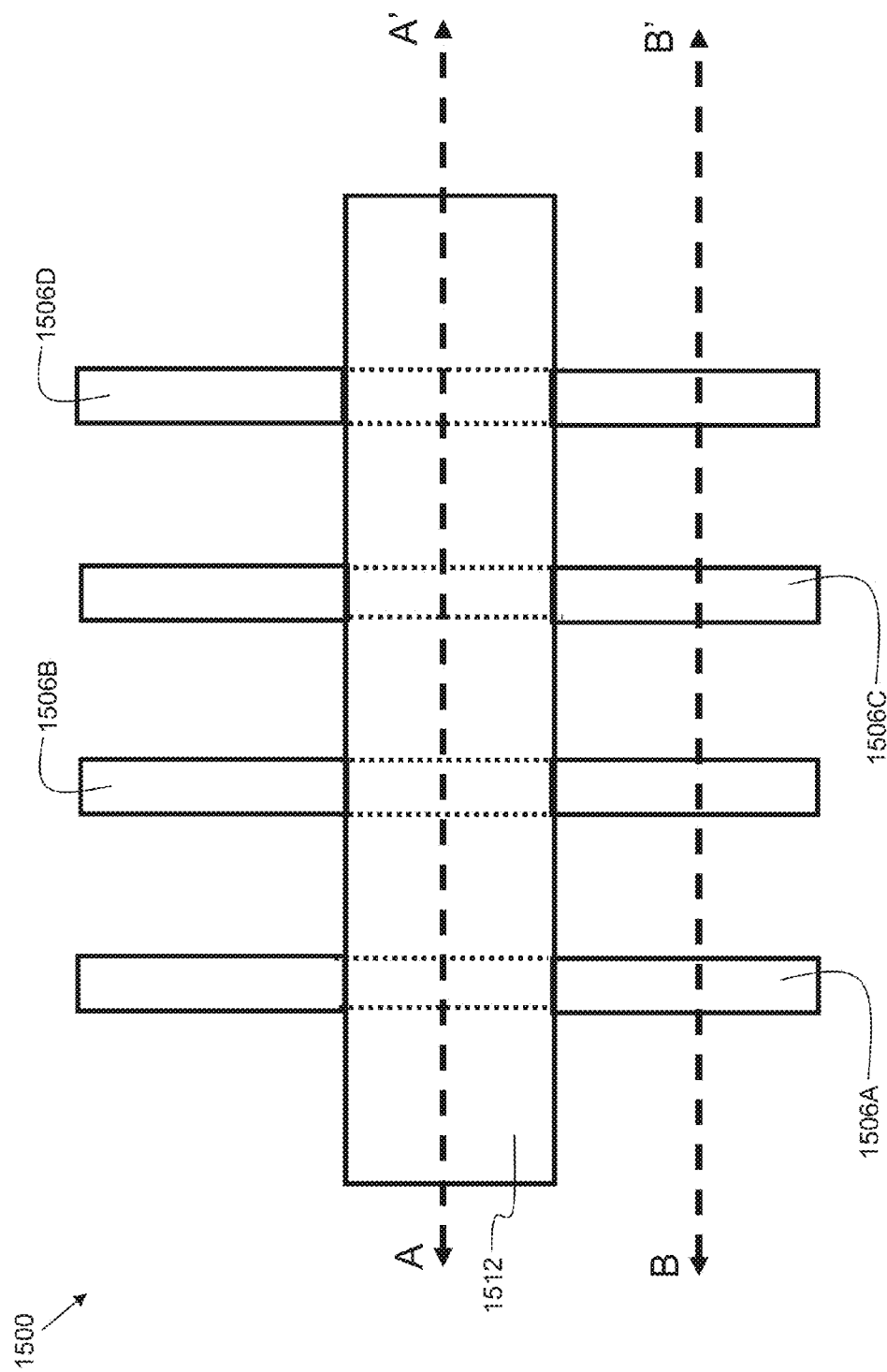

FIG. 15 shows a top-down view of a semiconductor structure similar to that shown in FIG. 14.

Figure 16:
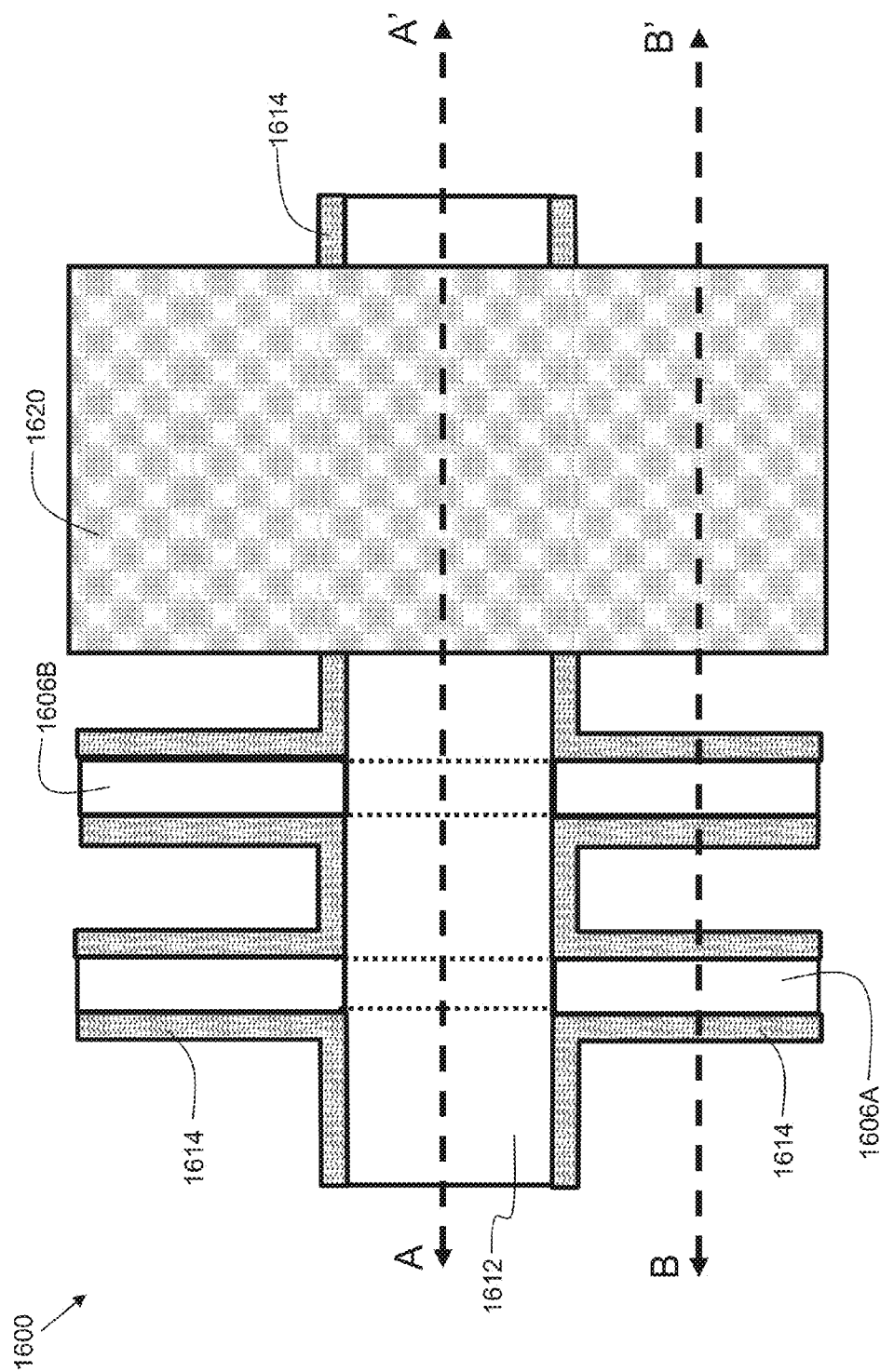

FIG. 16 shows a semiconductor structure after a subsequent process step of masking a first group of fins.

Figure 17:
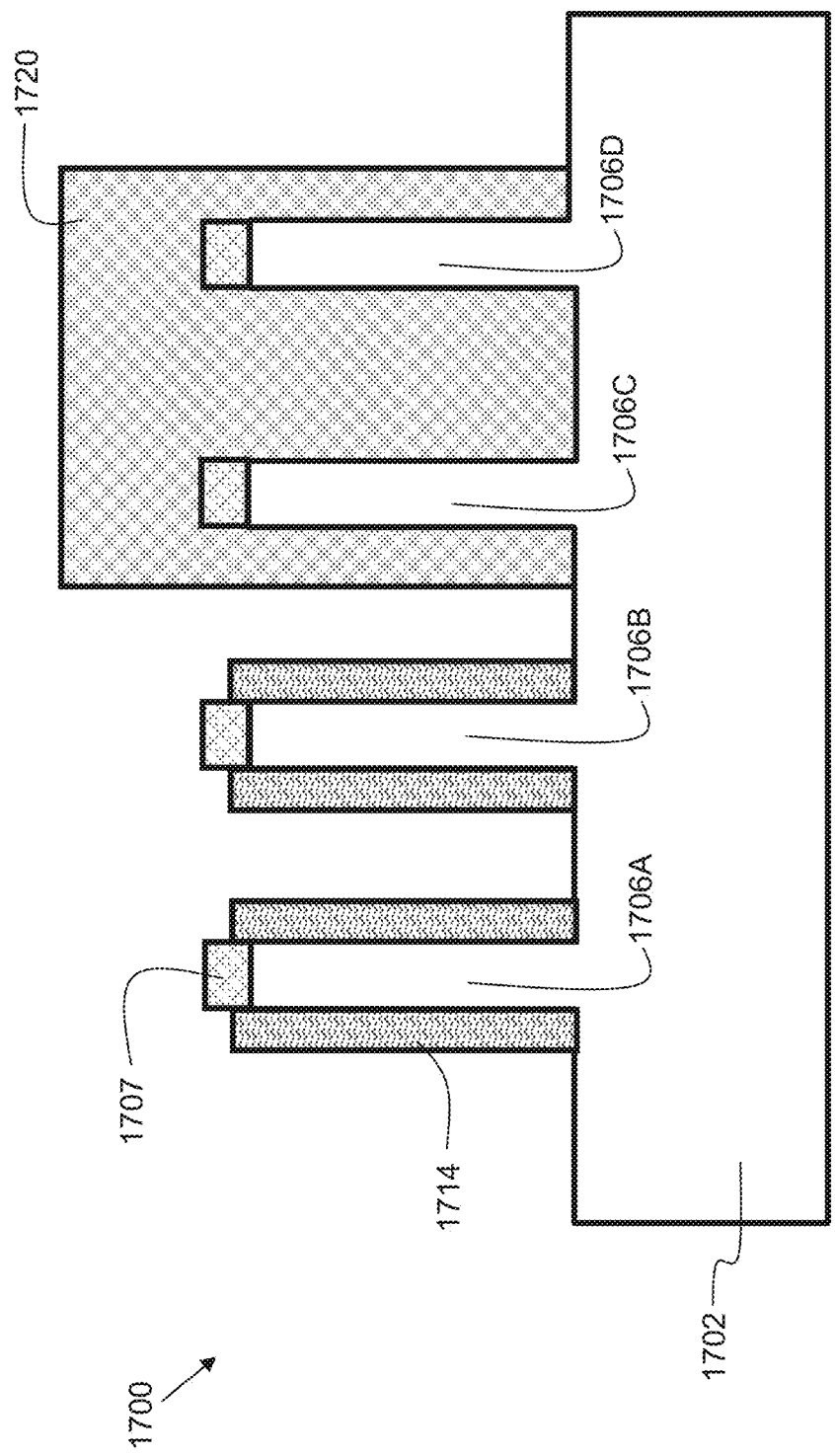

FIG. 17 shows a side view of a semiconductor structure similar to that shown in FIG. 16, as viewed along line B-B'.

Figure 18:
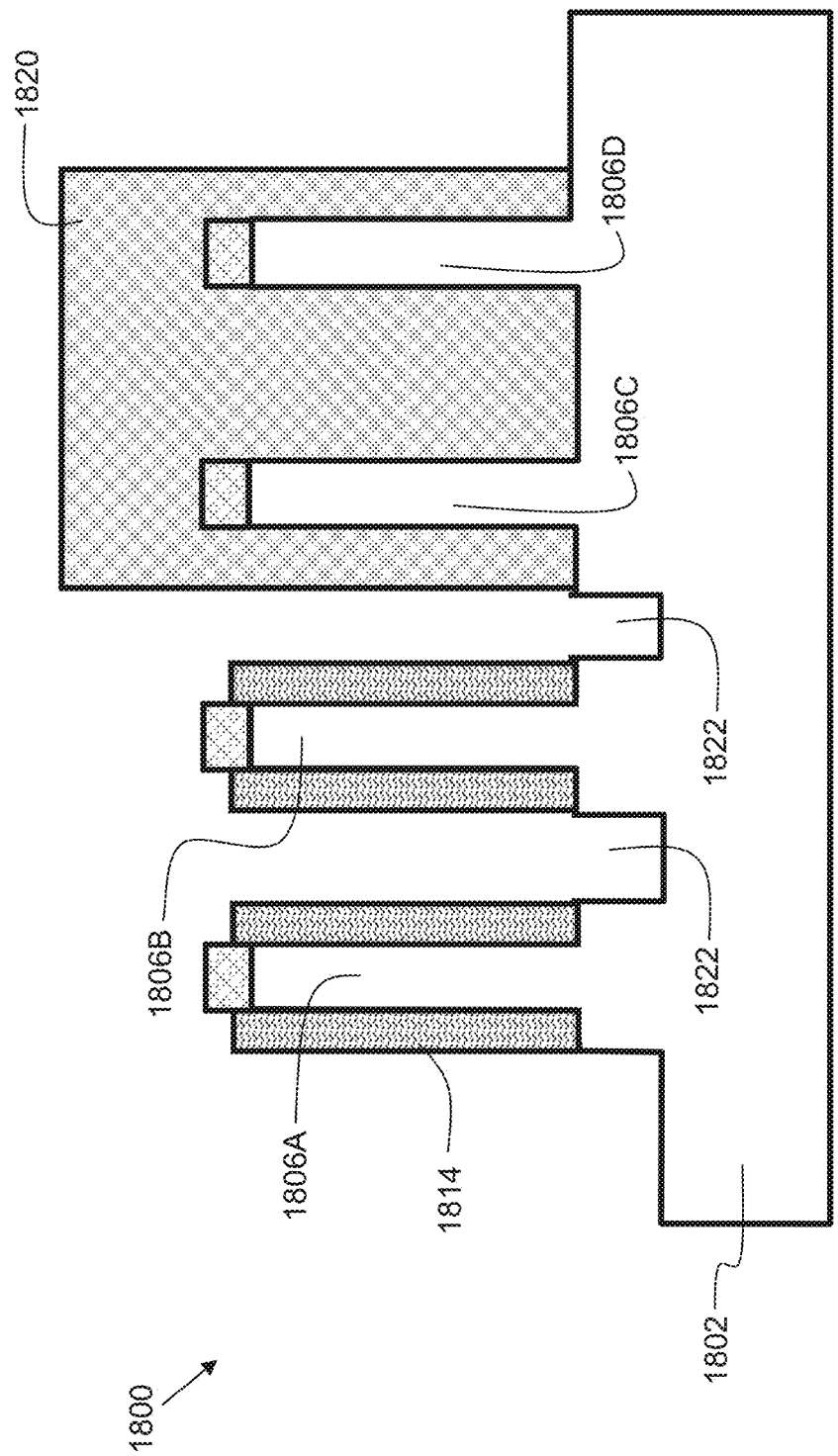

FIG. 18 shows a semiconductor structure after a subsequent process step of performing an etch to form cavities adjacent to the unmasked fins.

Figure 19:
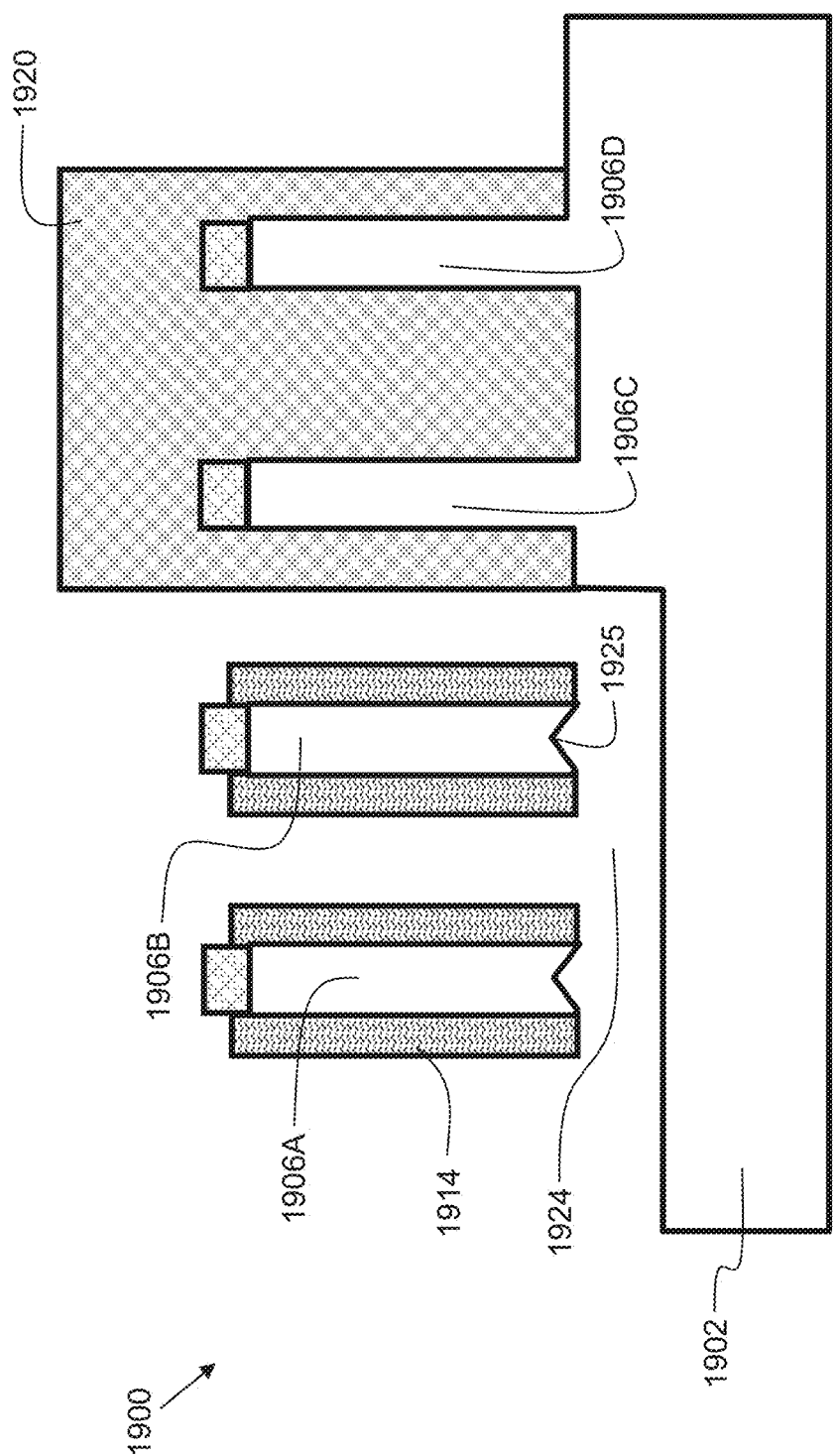
Figure 19A:
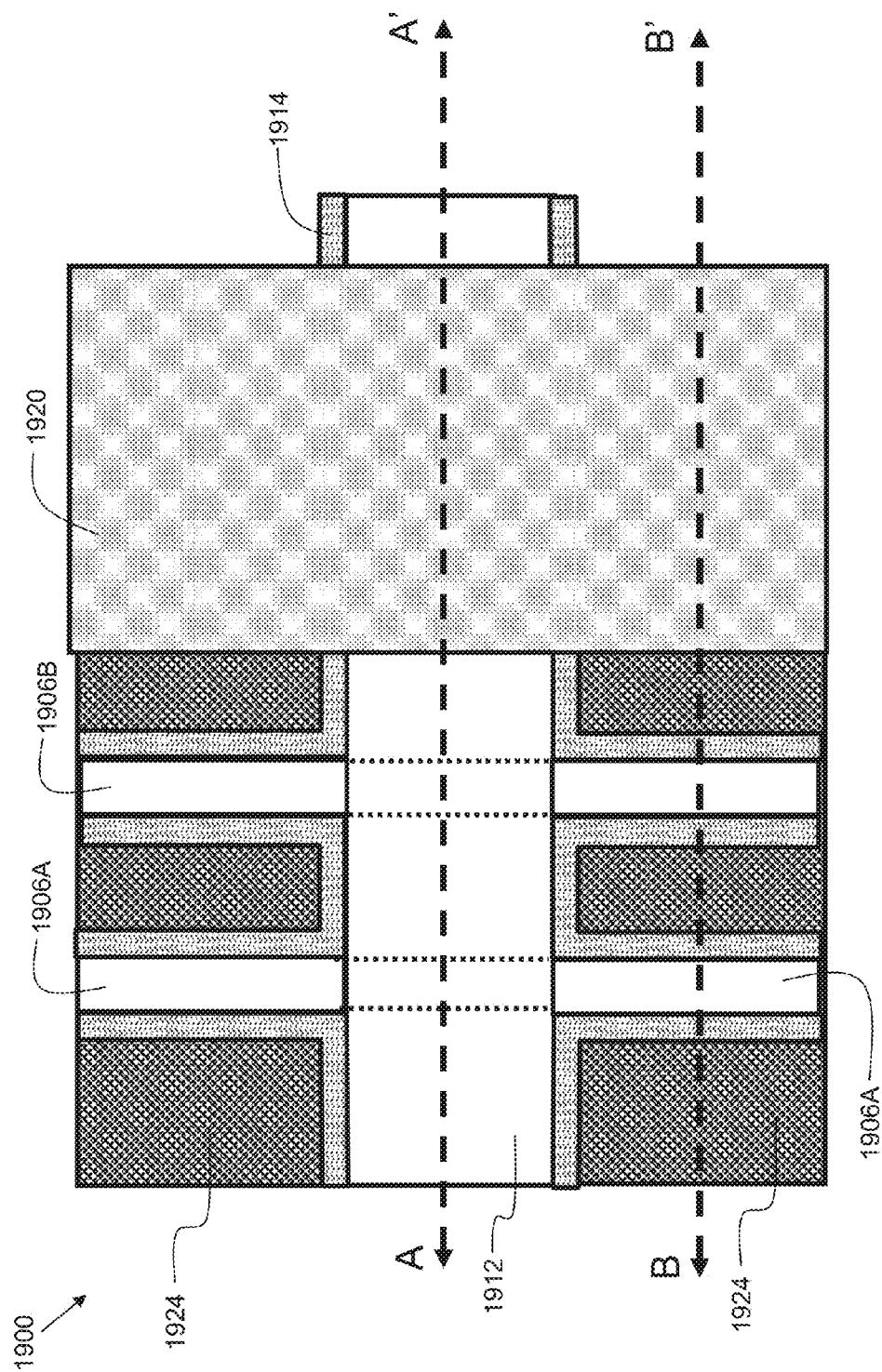

FIG. 19 and FIG. 19A show a semiconductor structure after a subsequent process step of performing an undercut etch.

Figure 20:
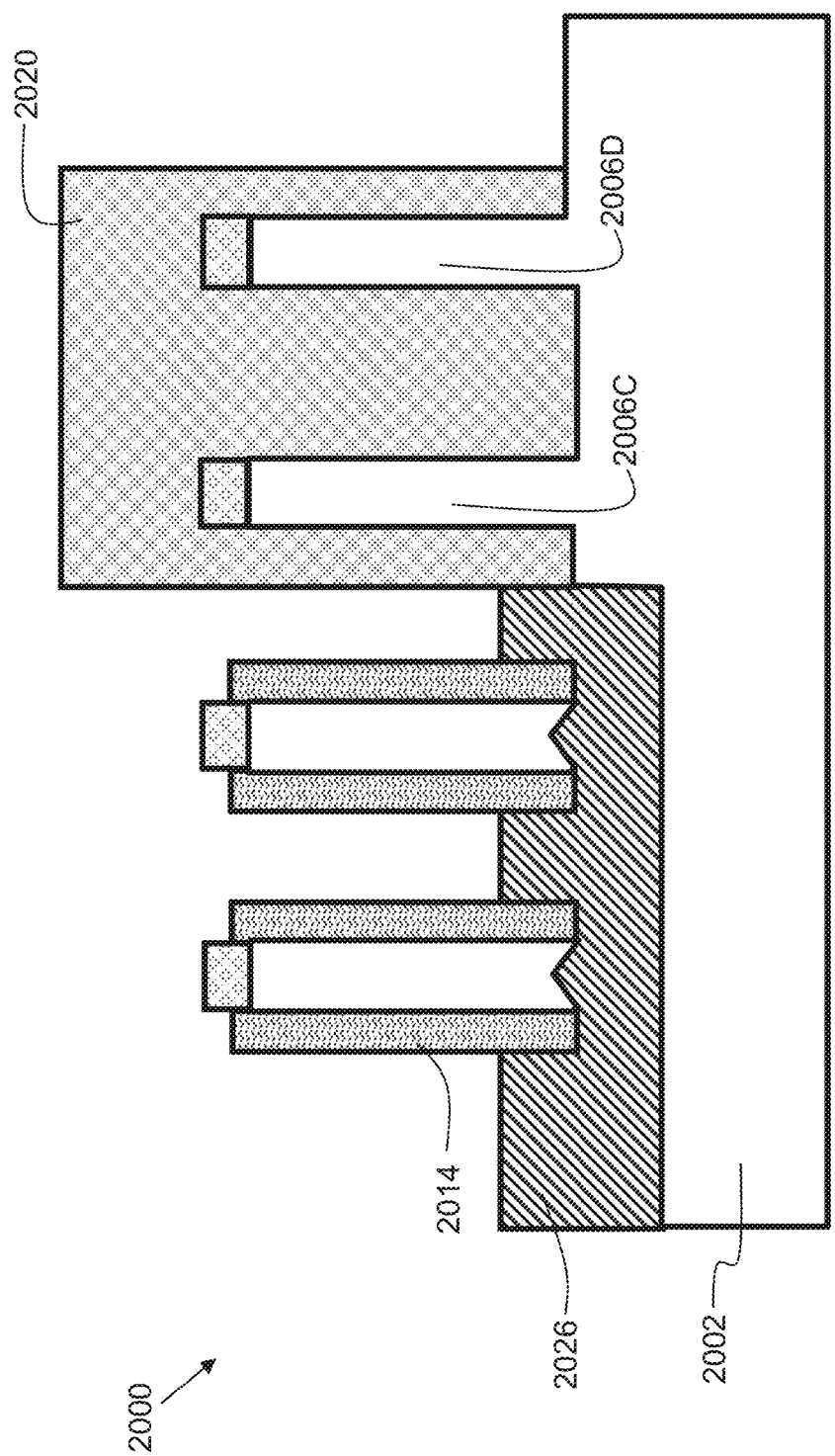

FIG. 20 shows a semiconductor structure after a subsequent process step of depositing an insulator layer.

Figure 21:
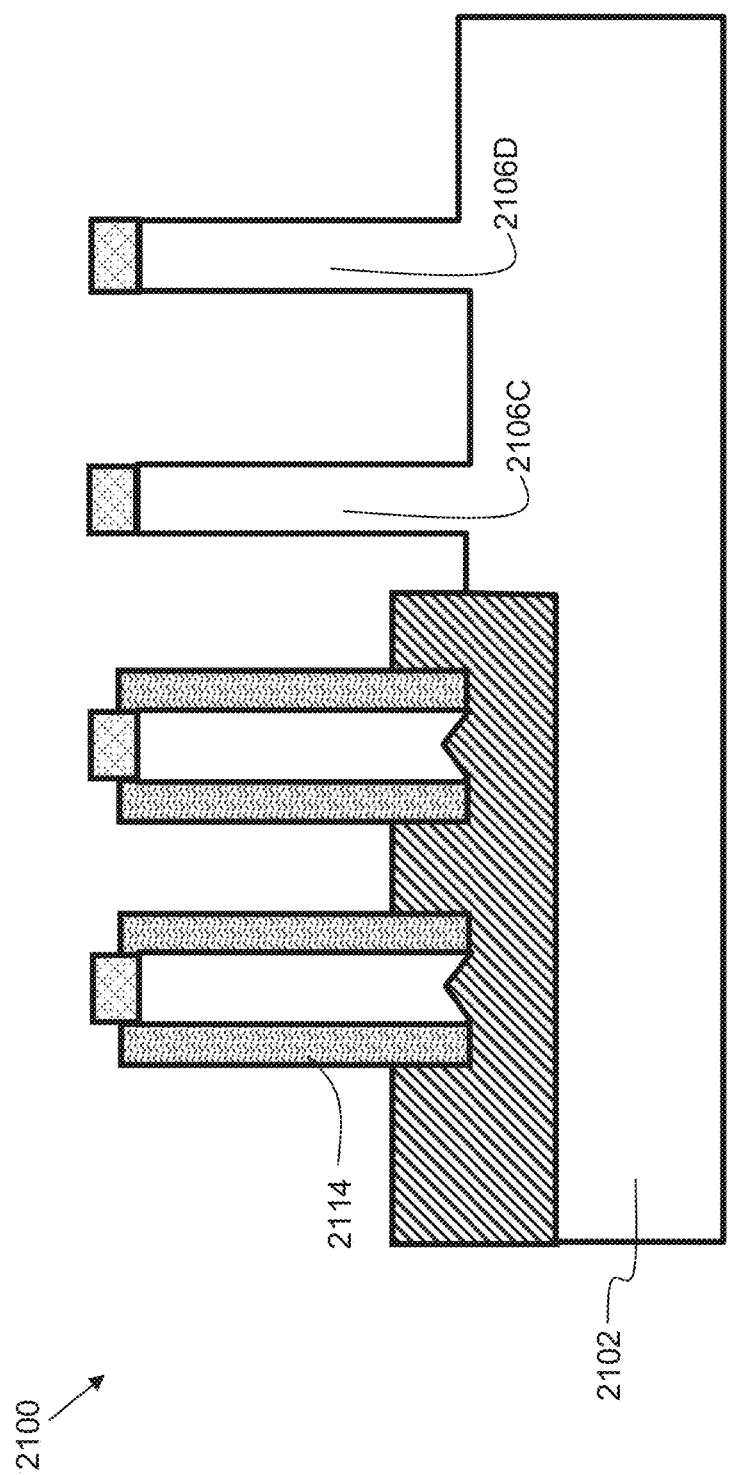

FIG. 21 shows a semiconductor structure after a subsequent process step of removing the mask from the first group of fins.

Figure 22:
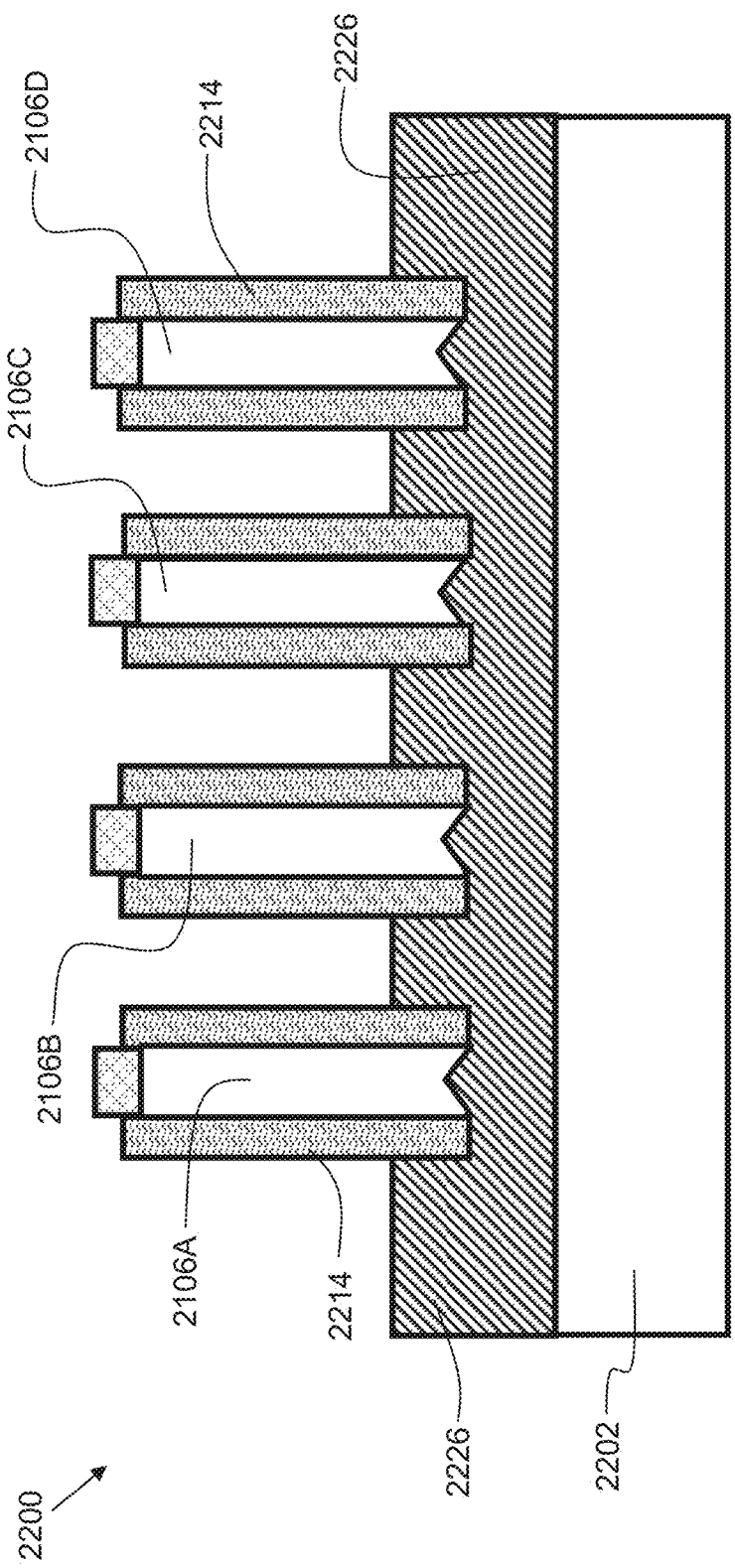

FIG. 22 shows a semiconductor structure after subsequent process steps including forming an insulator layer underneath the first group of fins.

Figure 23:
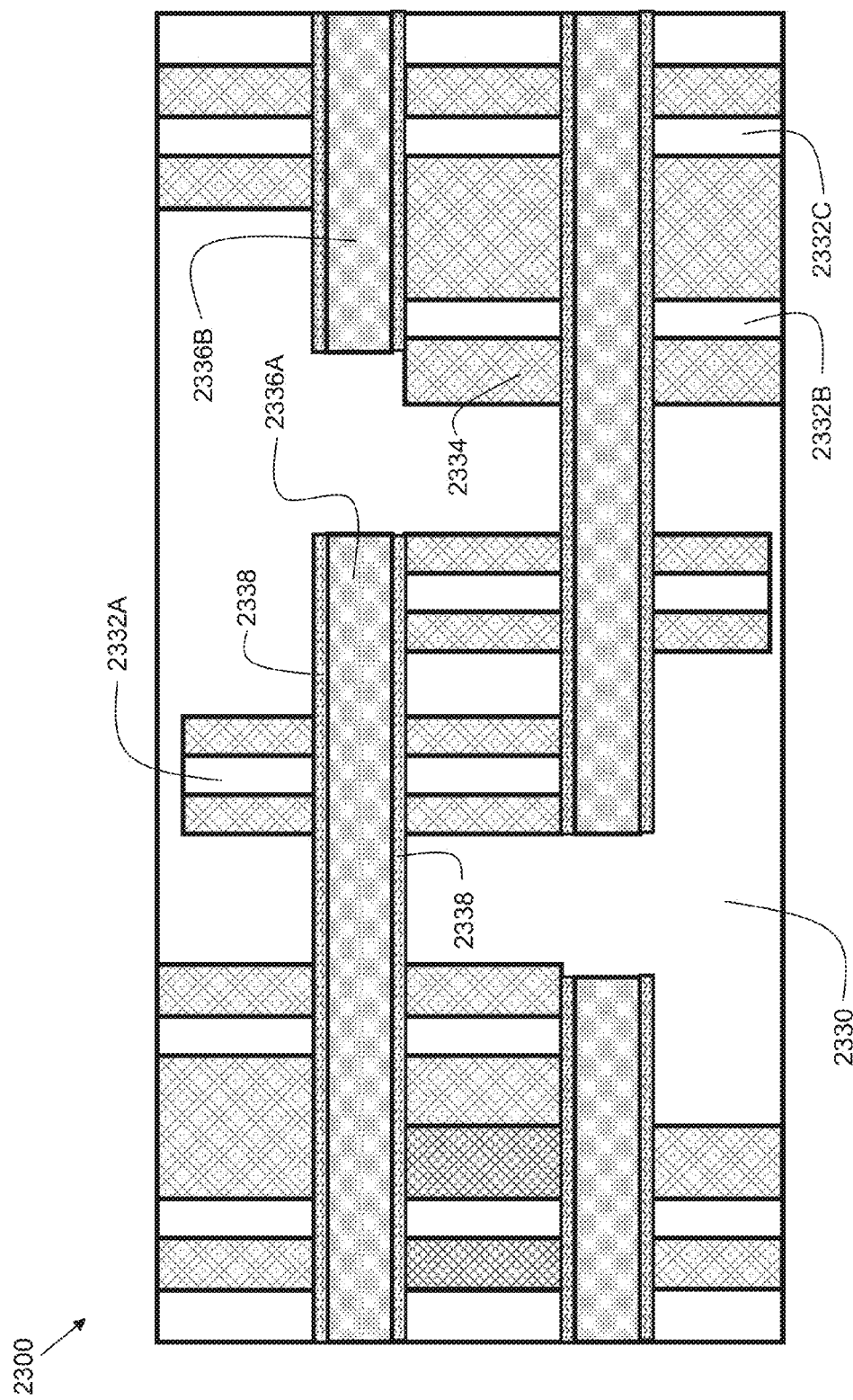

FIG. 23 shows a top down view of a circuit utilizing devices in accordance with embodiments of the present invention.

Figure 24:
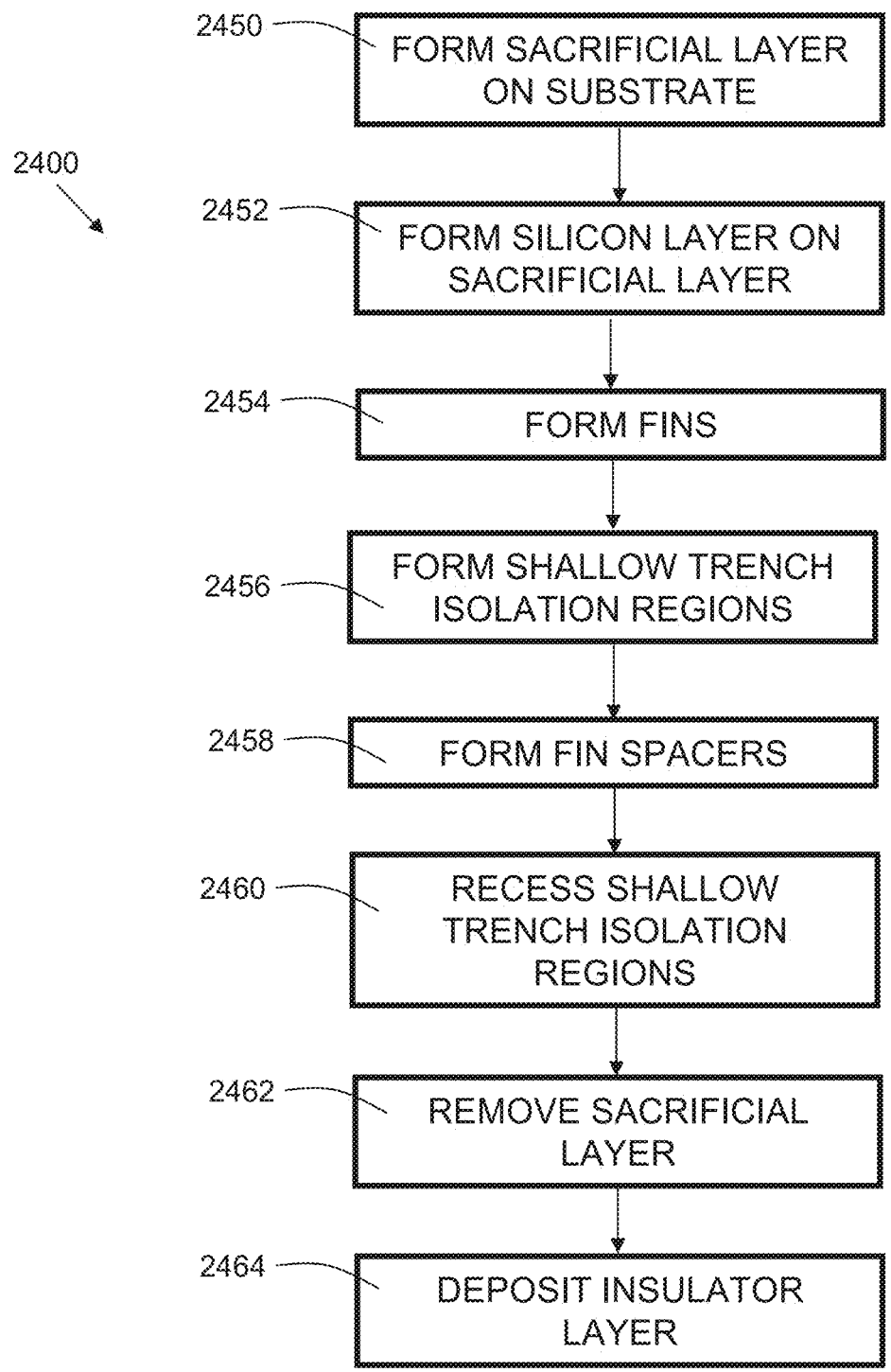

FIG. 24 is a flowchart indicating process steps for a method in accordance with an embodiment of the present invention.

Figure 25:
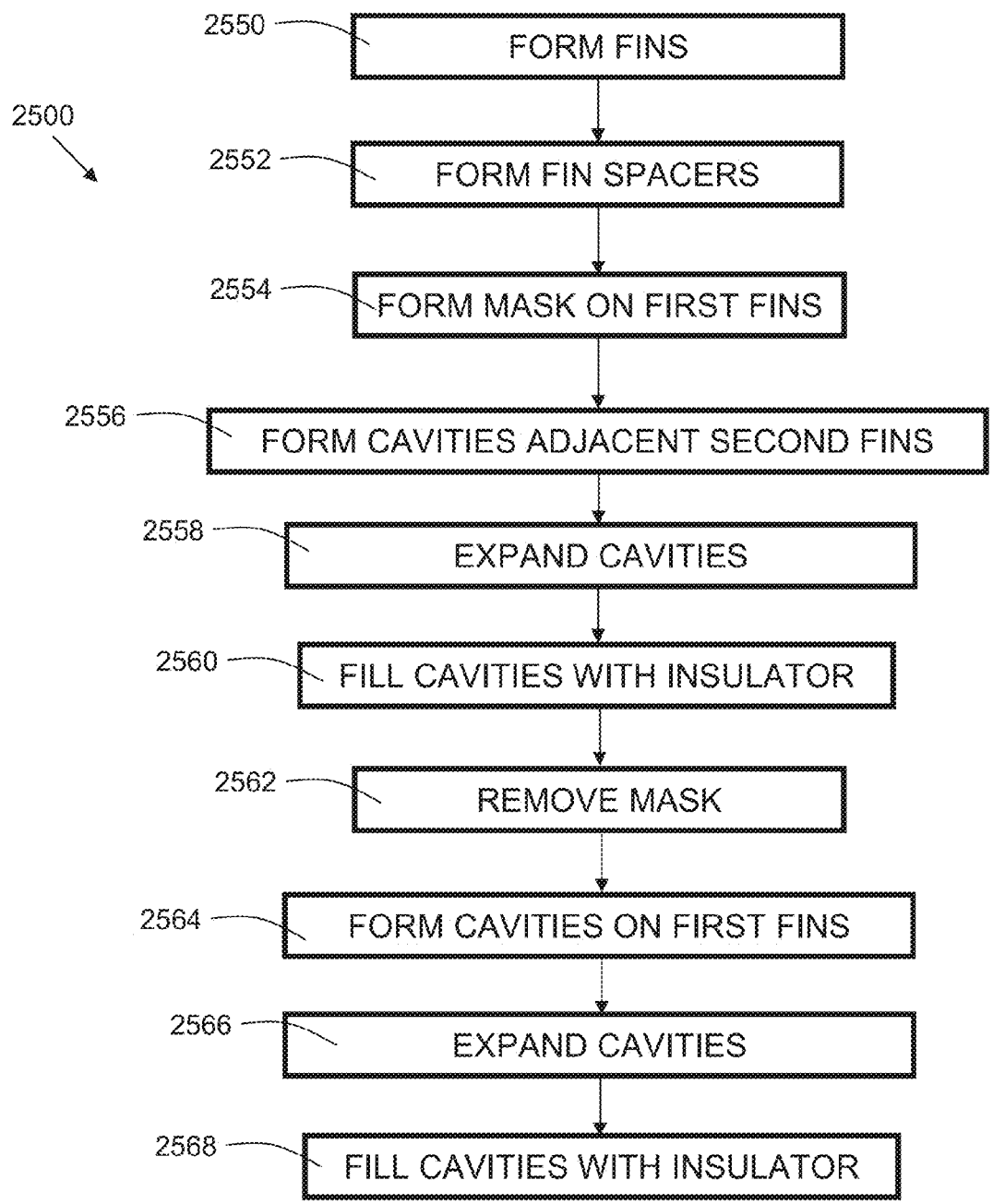

FIG. 25 is a flowchart indicating process steps for a method in accordance with an alternative embodiment of the present invention.

DETAILED DESCRIPTION

Silicon-on-nothing (SON) is a common approach to form a dielectric isolated silicon fin. One practical problem in the current SON process flow is that of silicon fin loss when removing a sacrificial layer to form the cavity where dielectric is to be filled. Even when selective etch techniques are used, they are not perfectly selective, and hence, fin etching occurs, resulting in a loss of fin material. This loss limits the critical dimension of the fin devices that can be used with the current SON process flow.

Within this disclosure, when an element as a layer, region, substrate, or wafer is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 shows a side view of a semiconductor structure 100 at a starting point for an embodiment of the present invention. Semiconductor structure 100 comprises semiconductor substrate 102 having a thickness S. Semiconductor substrate 102 may be comprised of silicon. A sacrificial layer 104 is blanket deposited over semiconductor substrate 102. Sacrificial layer 104 may be comprised of silicon germanium (SiGe). A second semiconductor layer 106 is blanket deposited over sacrificial layer 104. Second semiconductor layer 106 may also be comprised of silicon.

FIG. 2 shows a semiconductor structure 200 after a subsequent process step of fin formation. As stated previously, similar elements may be referred to by similar numbers in various figures (FIGs) of the drawing, in which case typically the last two significant digits may be the same. For example, semiconductor substrate 202 of FIG. 2 is similar to semiconductor substrate 102 of FIG. 1. Using standard patterning and etching techniques, fins 206 are formed. Each fin 206 is disposed on a sacrificial region 204. In embodiments, the fins 206 are comprised of silicon and the sacrificial regions 204 are comprised of SiGe. The semiconductor substrate is recessed to a thickness of R, where R is less than the original semiconductor substrate thickness S. In some embodiments, R is 5 to 10 nanometers less than S.

FIG. 3 shows a semiconductor structure 300 after a subsequent process step of depositing shallow trench isolation region 308. Shallow trench isolation (STI) region 308 may be comprised of oxide. After depositing the shallow trench isolation material, it may be planarized (e.g. via a chemical mechanical polish process), and recessed so that the top of the STI region 308 is above the bottom of the sacrificial regions 304 and below the top of the sacrificial regions 304. The STI region 308 is disposed on the semiconductor substrate 302 in the inter-fin regions (regions between each fin).

FIG. 4 shows a semiconductor structure 400 after a subsequent process step of depositing a gate dielectric layer 410. Gate dielectric layer 410 may be comprised of an oxide, including, but not limited to, silicon oxide, and hafnium oxide.

FIG. 5 shows a semiconductor structure 500 after a subsequent process step of forming a gate region 512. In some embodiments, gate region 512 is comprised of polysilicon. In some embodiments, a replacement metal gate (RMG) process may be used to replace the polysilicon gate with a metal gate in a future processing step.

FIG. 6 shows a top down view of a semiconductor structure 600 after a subsequent process step of spacer formation. In some embodiments, a conformal nitride layer is deposited over the semiconductor structure, and then recessed with a directional etch to expose the tops of the gate 612 and tops of the fins 606, while the nitride spacer 614 remains on the sides of the gate 612 and the sides of fins 606. Arrow A-A' represents a cross-section through the gate, and arrow B-B' represents a cross-section through the fins.

FIG. 7 shows a side view of a semiconductor structure 700 similar to the embodiment of FIG. 6, as viewed along line B-B' of FIG. 6. As shown in FIG. 7, spacers 714 are formed on the sides of fins 706.

FIG. 8 shows a semiconductor structure 800 after a subsequent process step of recessing the shallow trench isolation region 808 (compare with 708 of FIG. 7). The recessing of the shallow trench isolation (STI) region 808 creates an exposed portion 804E of sacrificial layer 804. When an etchant such as HCl is applied to the exposed portion 804E of the STI region 808, it allows the sacrificial layer 804 to be removed. The spacers 814 protect the fin sides. Thus, the fin width W is not affected by the removal of the sacrificial layer. The top and bottom of the fins may be slightly etched during removal of the sacrificial layer. This is because in practice, selective etch processes are not perfectly selective. While the etch rate of the sacrificial layer (e.g. SiGe) is much faster than that of the silicon fins 806, the silicon is still etched during the removal of the sacrificial layer. Due to the narrow width W of the fins, any reduction in the width of the fins can be detrimental to the performance of a finFET. In some embodiments, W may be in the range of 5 to 8 nanometers, and hence, losing 15 to 25 angstroms during removal of the sacrificial layer would be detrimental to the finFET performance. Spacers 814 protect the fin sides, and hence the SON process flow of embodiments of the present invention can be used with very narrow fins.

FIG. 9 shows a semiconductor structure 900 after a subsequent process step of removing the sacrificial layer (compare with 804 of FIG. 8). With the sacrificial layer removed, the fins 906 are supported by the gate structure (see 612 of FIG. 6). Along line A-A' of FIG. 6, the gate continues to support the fins, whereas along line B-B' of FIG. 6, there is now voids (cavities) 917 directly under fins 906, hence naming of the "silicon-on-nothing" process.

FIG. 10 shows a semiconductor structure 1000 after a subsequent process step of depositing an insulator layer 1016. Insulator layer 1016 may be a flowable oxide or spin-on-glass, and/or a conformal insulator such as oxide deposited by atomic layer deposition or low-pressure chemical vapor deposition (LPCVD). The flowable oxide flows into the voids created when the sacrificial layer was removed, providing electrical isolation for the fins 1006. The insulator layer 1016 may then be recessed to a desired level, where the insulator layer 1016 partially covers the spacers 1014. Region 1019 is an under-fin region (directly under fin 1006). Region 1021 is an inter-fin region (in between two fins). The insulator layer 1016 has a first thickness T1 in the under-fin region 1019, and a second thickness T2 in the inter-fin region 1021. T1 is greater than T2. In some embodiments, the first thickness T1 is between 2 times to 4 times greater than the second thickness T2. In some embodiments, first thickness T1 ranges from about 4 nanometers to about 8 nanometers, and second thickness T2 ranges from about 1 nanometer to about 2 nanometers. In the under-fin regions 1019, the insulator layer 1016 extends above and below the insulator layer 1016 in the inter-fin region 1021. Optionally, after depositing insulator layer 1016, a densification anneal may be performed to enhance densification of the insulator layer 1016. In one embodiment, the densification anneal may be performed at a temperature ranging from about 500 degrees Celsius to about 800 degrees Celsius. In another embodiment, the densification anneal may be performed at a temperature ranging from about 900 degrees Celsius to about 1100 degrees Celsius.

FIG. 11 shows a semiconductor structure 1100 after a subsequent process step of recessing the spacers 1114 (compare with 1014 of FIG. 10). Spacers 1114 are embedded spacers, meaning that they are embedded within insulator layer 1116.

FIG. 12 shows a semiconductor structure 1200 after a subsequent process step of fin merging. An epitaxially grown semiconductor region 1218 electrically merges fins 1206A and 1206B. Semiconductor region 1218 may comprise silicon. Depending on the circuit design, various groups of fins may be merged together to form finFETs with the desired characteristics. In general, region 1218 may comprise an epitaxial silicon region disposed on, and in direct physical contact with multiple neighboring fins.

FIG. 13 shows a top down view of a semiconductor structure 1300 similar to that shown in FIG. 12. Fin 1306 has a width G in the gate region and a width F in the fin region. In embodiments of the present invention, widths F and G are substantially equal, because the fin sides are protected during the removal of the sacrificial layer, and so the original width of the fins is preserved.

FIG. 14 shows a side view of a semiconductor structure 1400 at a starting point for an alternative embodiment of the present invention. Structure 1400 comprises semiconductor substrate 1402, which may be comprised of silicon. Fins 1406 are formed on semiconductor substrate 1402. Fins 1406 may be formed using industry-standard techniques of patterning and etching. Fins 1406 are comprised of the same material as semiconductor substrate 1402. A pad nitride layer 1407 may be disposed on the fins to protect the fins 1406 during subsequent processing steps. In this alternative embodiment, no explicit sacrificial layer is used. Instead, masking is used to enable the use of a SON process flow without the need for an explicit sacrificial layer.

FIG. 15 shows a top-down view of a semiconductor structure 1500 similar to that shown in FIG. 14. Semiconductor structure 1500 comprises four fins (1506A, 1506B, 1506C, and 1506D). Gate region 1512 is disposed over the four fins. Line A-A' represents a cross-section through the gate. Line B-B' represents a cross-section through the fins.

FIG. 16 shows a semiconductor structure 1600 after a subsequent process step of masking a first group of fins. A mask region 1620 is deposited over a first group of fins. The first group of fins may be fins corresponding to a P-type finFET. The unmasked fins 1606A and 1606B are part of a second group of fins. The second group of fins may be fins corresponding to an N-type finFET. Nitride spacers 1614 are formed on the second group of fins 1614. In some embodiments, mask region 1620 may be comprised of nitride. In other embodiments, mask region 1620 may be comprised of amorphous carbon.

FIG. 17 shows a side view of a semiconductor structure 1700 similar to that shown in FIG. 16, as viewed along line B-B'. Mask region 1720 protects fins 1706C and 1706D, while fins 1706A and 1706B are unmasked. Unmasked fins 1706A and 1706B are protected by pad nitride layer 1707 on top, and nitride spacers 1714 on the sides. The semiconductor substrate 1702 is exposed in the areas adjacent to fins 1706A and 1706B.

FIG. 18 shows a semiconductor structure 1800 after a subsequent process step of performing an etch to form cavities 1822 adjacent to unmasked fins 1806A and 1806B. The mask 1820 protects the substrate 1802 in the areas adjacent to fins 1806C and 1806D, so no cavities are formed in those areas.

FIG. 19 and FIG. 19A show a semiconductor structure 1900 after a subsequent process step of performing an undercut (lateral) etch. FIG. 19A is a top down view, and FIG. 19 is a side view along line B-B' of FIG. 19A. The undercut etch forms cavity 1924 under the unmasked fins 1906A and 1906B. The fins 1906A and 1906B are supported by the gate (see 1912 of FIG. 19A). The cavity 1924 does not go under the fins 1906C and 1906D that are covered by mask 1920, so those fins, along with gate 1912, provide anchoring for unmasked fins 1906A and 1906B while the cavity 1924 exists below them. The undercut etch slightly etches upward into the base of the unmasked fins 1906A and 1906B, forming indentation 1925 at the fin base.

FIG. 20 shows a semiconductor structure 2000 after a subsequent process step of depositing an insulator layer 2026. Insulator layer 2026 may be a flowable oxide. The insulator layer 2026 may then be recessed to a desired level.

FIG. 21 shows a semiconductor structure 2100 after a subsequent process step of removing the mask from the first group of fins 2106C and 2106D (compare with 2020 of FIG. 20). In the embodiments where mask 2020 is comprised of amorphous carbon, the mask 2020 may be removed with an oxygen etch.

FIG. 22 shows a semiconductor structure 2200 after subsequent process steps including forming an insulator layer 2226 which extends underneath the first group of fins 2106C and 2106D as well as second group of fins 2106A and 2106B. Nitride spacers 2214 may be formed on the fins 2106C and 2106D. As can be seen in FIG. 22, an insulator (dielectric) layer 2226 is formed using a SON process flow without the need for an explicit sacrificial layer. The fin sides are protected during the SON process, so that no adverse fin thinning occurs during formation of cavities underneath the fins.

FIG. 23 shows a top down view of a circuit 2300 utilizing devices in accordance with embodiments of the present invention. To make various circuits, such as, for example, an SRAM cell, gates and fins may be cut at various places to form individual transistors, and some fins may be merged together while other fins may remain separate. For example, fins 2332B and 2332C are merged via epitaxial semiconductor region 2334, whereas fin 2332A remains as a single fin. Gate region 2336A is cut to separate it from gate 2336B. Gate regions continue to have a spacer 2338 formed thereon. Region 2330 is a dielectric region, and may be comprised of oxide. The spacers may be removed from the fins as part of the remaining semiconductor fabrication process.

FIG. 24 is a flowchart 2400 indicating process steps for a method in accordance with an embodiment of the present invention. In process step 2450, a sacrificial layer is formed on a substrate (see layer 104 on substrate 102 of FIG. 1). In process step 2452, a silicon layer is formed on the sacrificial layer (see layer 106 on substrate 104 of FIG. 1). In process step 2454, fins are formed (see 206 of FIG. 2). In process step 2456, shallow trench isolation regions are formed (see 308 of FIG. 3). In process step 2458, fin spacers are formed (see 614 of FIG. 6). In process step 2460, the shallow trench isolation regions are recessed to expose the sacrificial layer (see 808 of FIG. 8). In process step 2462, the sacrificial layer is removed (see 900 of FIG. 9). In process step 2464, an insulator layer is deposited (see 1016 of FIG. 10).

FIG. 25 is a flowchart 2500 indicating process steps for a method in accordance with an alternative embodiment of the present invention. In process step 2550, fins are formed (see 1406 of FIG. 14). In process step 2552, fin spacers are formed (see 1614 of FIG. 16). In process step 2554, a mask is formed on a first group of fins (see 1620 of FIG. 16). This leaves the unmasked fins as a second group of fins. In some embodiments, the first group of fins may correspond to P-type finFET fins, and the second group of fins may correspond to N-type finFET fins. In process step 2556, cavities are formed adjacent to the unmasked fins (see 1822 of FIG. 18). In process step 2558, the cavities are expanded via a lateral etch (see 1924 of FIG. 19 and FIG. 19A). In process step 2560, the cavities are filled with an insulator, such as flowable oxide (see 2026 of FIG. 20). In process step 2562, the mask is removed (see 2100 of FIG. 21). In process step 2564, cavities are formed on the first group of fins (in a manner similar to forming cavities 1822 of FIG. 18). In process step 2566, the cavities are expanded (in a manner similar to forming cavities 1924 of FIG. 19). In process step 2568, the cavities are filled with an insulator, such as flowable oxide (see 2226 of FIG. 22).

As can now be appreciated, embodiments of the present invention provide an improved finFET and method of fabrication using a silicon-on-nothing process flow. Nitride spacers protect the fin sides during formation of cavities underneath the fins for the silicon-on-nothing (SON) process. A flowable oxide fills the cavities to form an insulating dielectric layer under the fins.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor structure, comprising:
   forming a sacrificial layer on a semiconductor substrate;
   forming fins on the sacrificial layer above a top elevation of the sacrificial layer;
   forming a shallow trench isolation region on the semiconductor substrate, wherein the shallow trench isolation region is disposed in between each fin;
   forming spacers on the fins;
   recessing the shallow trench isolation region;
   removing the sacrificial layer, thereby forming a void in the semiconductor structure;
   depositing an insulator layer in the void, wherein the insulator layer partially covers the spacers, leaving an exposed portion of the spacers; and
   removing the exposed portion of the spacers.

2. The method of claim 1, further comprising growing an epitaxial region directly on the fins.

3. The method of claim 1, wherein forming the sacrificial layer on the semiconductor substrate comprises forming a SiGe layer.

4. The method of claim 1, further comprising performing a densification anneal after depositing the insulator layer in the void.

5. The method of claim 4, wherein the performing a densification anneal comprises performing an anneal at a temperature ranging from about 500 degrees Celsius to about 800 degrees Celsius.

6. The method of claim 4, wherein the performing a densification anneal comprises performing an anneal at a temperature ranging from about 900 degrees Celsius to about 1100 degrees Celsius.

7. The method of claim 1, wherein depositing the insulator layer in the void comprises depositing a flowable oxide.

8. The method of claim 1, wherein depositing the insulator layer in the void comprises depositing spin-on glass.

9. The method of claim 1, wherein depositing the insulator layer in the void is performed with atomic layer deposition.

10. The method of claim 1, wherein depositing the insulator layer in the void is performed with low-pressure chemical vapor deposition.

* * * * *